(12) United States Patent
Okabe et al.

(10) Patent No.: US 12,402,289 B2
(45) Date of Patent: Aug. 26, 2025

(54) MODULE WITH REDUCED PARASITE CAPACITANCE

(71) Applicant: Murata Manufacturing Co., Ltd., Kyoto (JP)

(72) Inventors: Ryohei Okabe, Nagaokakyo (JP); Tadashi Nomura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 154 days.

(21) Appl. No.: 18/169,308

(22) Filed: Feb. 15, 2023

(65) Prior Publication Data
US 2023/0200033 A1 Jun. 22, 2023

Related U.S. Application Data

(63) Continuation of application No. PCT/JP2021/030038, filed on Aug. 17, 2021.

(30) Foreign Application Priority Data

Sep. 3, 2020 (JP) .................................. 2020-148090

(51) Int. Cl.
*H05K 9/00* (2006.01)

(52) U.S. Cl.
CPC ......... *H05K 9/0024* (2013.01); *H05K 9/0088* (2013.01)

(58) Field of Classification Search
CPC H05K 9/0024; H05K 9/0088; H01L 23/3135; H01L 23/3121; H01L 25/072; H01L 23/552; H01L 25/04; H01L 25/18
See application file for complete search history.

(56) References Cited

U.S. PATENT DOCUMENTS 7,999,196 B2 * 8/2011 Hsieh ................... H05K 9/0045
174/386
8,072,769 B2 * 12/2011 Ieki ........................ H05K 1/187
361/764
(Continued)

FOREIGN PATENT DOCUMENTS

JP 2013-251323 A 12/2013
WO 2015/133024 A1 9/2015
(Continued)

OTHER PUBLICATIONS

International Search Report for PCT/JP2021/030038 dated Nov. 16, 2021.

*Primary Examiner* — Rockshana D Chowdhury
(74) *Attorney, Agent, or Firm* — McDonald Hopkins LLC (57) ABSTRACT

It is to provide to a module and a method of manufacturing the module in which parasitic capacitance generated between two shield films is reduced without hindering reduction in height of a module. The module includes, a substrate, a component mounted on an upper surface that is one main surface of the substrate, a first shield film provided on an upper surface of the component, sealing resin provided on an upper surface of the substrate so as to seal the component, a second shield film provided on an upper surface or an upper side of the sealing resin, and a low dielectric member arranged between the first shield film and the second shield film and having a dielectric constant lower than a dielectric constant of the sealing resin.

6 Claims, 7 Drawing Sheets

(56) References Cited

U.S. PATENT DOCUMENTS

| | | | | |
|---|---|---|---|---|
| 8,536,958 | B2* | 9/2013 | Omura | H03H 9/0576 |
| | | | | 333/133 |
| 10,026,701 | B1* | 7/2018 | Rodenbeck | H01L 23/3135 |
| 10,217,711 | B2 | 2/2019 | Yoon et al. | |
| 10,553,542 | B2* | 2/2020 | Shin | H01L 23/3128 |
| 10,566,293 | B2* | 2/2020 | Kuk | H05K 1/0218 |
| 10,903,156 | B2* | 1/2021 | Pahl | H01L 23/49838 |
| 11,605,571 | B2* | 3/2023 | Teixeira De Queiros | |
| | | | | H01L 25/18 |
| 2006/0002099 | A1* | 1/2006 | Stoneham | H05K 9/0024 |
| | | | | 361/816 |
| 2016/0336268 | A1 | 11/2016 | Kamikura et al. | |
| 2019/0019763 | A1* | 1/2019 | Chang | H01L 23/552 |
| 2020/0161259 | A1* | 5/2020 | Otsubo | H01L 23/29 |
| 2020/0185354 | A1* | 6/2020 | Iwamoto | H01L 24/85 |
| 2022/0310529 | A1* | 9/2022 | Chen | H01L 23/3735 |

FOREIGN PATENT DOCUMENTS

| | | |
|---|---|---|
| WO | 2018/181708 A1 | 10/2018 |
| WO | 2019/026902 A1 | 2/2019 |

\* cited by examiner

MODULE WITH REDUCED PARASITE CAPACITANCE

CROSS REFERENCE TO RELATED APPLICATION

This is a continuation of International Application No. PCT/JP2021/030038 filed on Aug. 17, 2021 which claims priority from Japanese Patent Application No. 2020-148090 filed on Sep. 3, 2020. The contents of these applications are incorporated herein by reference in their entireties.

BACKGROUND OF THE DISCLOSURE

Field of the Disclosure

The present disclosure relates to a module in which an electronic component is mounted on a substrate.

Description of the Related Art

Conventionally, as this type of module, for example, a module described in Patent Document 1 (U.S. Pat. No. 10,217,711) is known. Patent Document 1 discloses a module in which a shielded component covered with a shield film that shields electromagnetic waves and other components are mounted on one main surface of a substrate, and all components are sealed with sealing resin.
Patent Document 1: U.S. Pat. No. 10,217,711

BRIEF SUMMARY OF THE DISCLOSURE

Based on the configuration of Patent Document 1, the present inventors have developed a module including an additional shield film that covers the sealing resin in order to prevent an external electromagnetic wave from affecting the other components. In such a module, in a case where potential of a ground point is different between an existing shield film and an additional shield film, parasitic capacitance is generated between the two shield films. The parasitic capacitance may cause malfunction of the module. The parasitic capacitance may be reduced as a distance between the two shield films is increased, but reduction in height of the module is hindered. From this point of view, there is still room for improvement in the configuration of the module.

Therefore, a possible benefit of the present disclosure is to solve the above problem, and to provide a module in which parasitic capacitance generated between two shield films is reduced without hindering reduction in height of the module.

To achieve the possible benefit, a module according to an aspect of the present disclosure includes:
 a substrate;
 a component mounted on an upper surface that is one main surface of the substrate;
 a first shield film provided on an upper surface of the component;
 sealing resin provided on an upper surface of the substrate so as to seal the component;
 a second shield film provided on an upper surface or an upper side of the sealing resin; and
 a low dielectric member arranged between the first shield film and the second shield film and having a dielectric constant lower than a dielectric constant of the sealing resin.

Further, a method of manufacturing a module according to one aspect of the present disclosure includes the steps of:
 preparing a substrate on which a component having a first shield film is mounted on an upper surface which is one main surface;
 providing sealing resin on an upper surface of the substrate to seal the component;
 removing a part of the sealing resin from an upper surface of the sealing resin toward the first shield film;
 providing a low dielectric member having a dielectric constant lower than a dielectric constant of the sealing resin in a space formed by removing a part of the sealing resin; and
 forming a second shield film on an upper side or an upper surface of the low dielectric member and another part of the sealing resin.

According to the present disclosure, it is possible to reduce parasitic capacitance generated between two shield films without hindering reduction in height of a module.

DETAILED DESCRIPTION OF THE DISCLOSURE

According to an aspect of the present disclosure, there is provided a module including:
 a substrate;
 a component mounted on an upper surface that is one main surface of the substrate;
 a first shield film provided on an upper surface of the component;

sealing resin provided on an upper surface of the substrate so as to seal the component;
a second shield film provided on an upper surface or an upper side of the sealing resin; and
a low dielectric member arranged between the first shield film and the second shield film and having a dielectric constant lower than a dielectric constant of the sealing resin.

According to a second aspect of the present disclosure, there is provided the module according to the first aspect, in which
the low dielectric member is formed in a tapered shape such that an area of an upper surface on the second shield film side is larger than an area of a lower surface on the first shield film side.

According to a third aspect of the present disclosure, there is provided the module according to the first or second aspect, in which
the first shield film is further provided on a side surface of the component, and
surface roughness of the first shield film provided on an upper surface of the component is greater than surface roughness of the first shield film provided on a side surface of the component.

According to a fourth aspect of the present disclosure, there is provided the module according to any one of the first to third aspects, in which
at least one of the first shield film and the second shield film is in contact with the low dielectric member.

According to a fifth aspect of the present disclosure, there is provided the module according to the fourth aspect, in which
the second shield film in contact with the low dielectric member is formed of metal that is passive metal and transition metal or an alloy containing the metal, and a surface of the low dielectric member in contact with the metal or the alloy containing the metal has a nitrogen functional group.

According to a sixth aspect of the present disclosure, there is provided a method of manufacturing a module, the method including the steps of:
preparing a substrate on which a component having a first shield film is mounted on an upper surface which is one main surface;
providing sealing resin on an upper surface of the substrate to seal the component;
removing a part of the sealing resin from an upper surface of the sealing resin toward the first shield film provided on an upper surface of the component;
providing a low dielectric member having a dielectric constant lower than a dielectric constant of the sealing resin in a space formed by removing a part of the sealing resin; and
forming a second shield film on an upper side or an upper surface of the low dielectric member and another part of the sealing resin.

According to a seventh aspect of the present disclosure, there is provided a method of manufacturing a module, the method including the steps of:
preparing a substrate on which a component having a first shield film is mounted on an upper surface which is one main surface;
providing a dielectric member on an upper surface of the first shield film provided on an upper surface of the component;
providing sealing resin on an upper surface of the substrate so as to seal the component and the dielectric member; and
forming a second shield film on an upper surface of the sealing resin and an upper side of the dielectric member, wherein
the dielectric member is a low dielectric member having a dielectric constant lower than a dielectric constant of the sealing resin.

According to an eighth aspect of the present disclosure, there is provided the method of manufacturing a module according to the seventh aspect, the method further including the step of:
exposing an upper surface of the dielectric member by removing a part of the sealing resin after the step of providing the sealing resin, wherein
the step of forming the second shield film includes forming the second shield film on the exposed upper surface of the dielectric member and an upper surface of another part of the sealing resin.

Hereinafter, an embodiment of the present disclosure will be described with reference to the accompanying drawings. Note that the present disclosure is not limited to the embodiment below. Further, in the drawings, substantially the same members are denoted by the same reference numerals, and omitted from description.

Further, hereinafter, terms indicating directions such as "upper surface", "lower surface", and "side surface" are used for convenience of description. However, these terms do not mean to limit a use state or the like of the module according to the present disclosure.

EMBODIMENT

Figure 1:
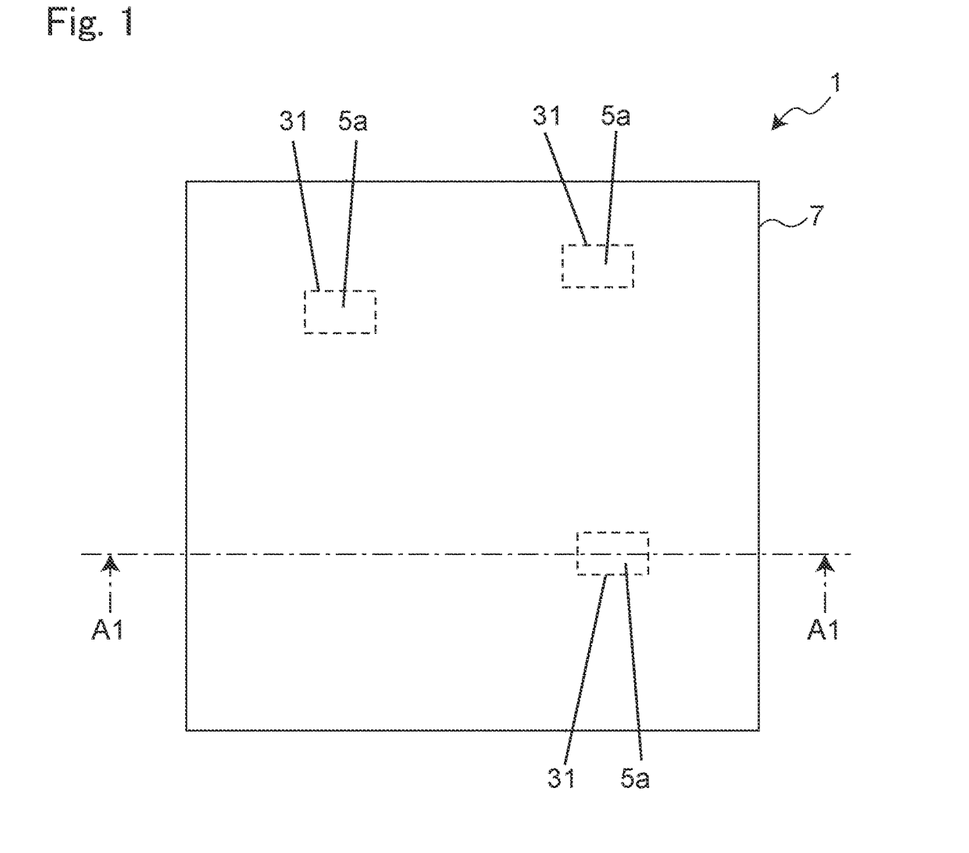
FIG. 1 is a top view schematically illustrating a module according to an embodiment of the present disclosure.
Figure 2:
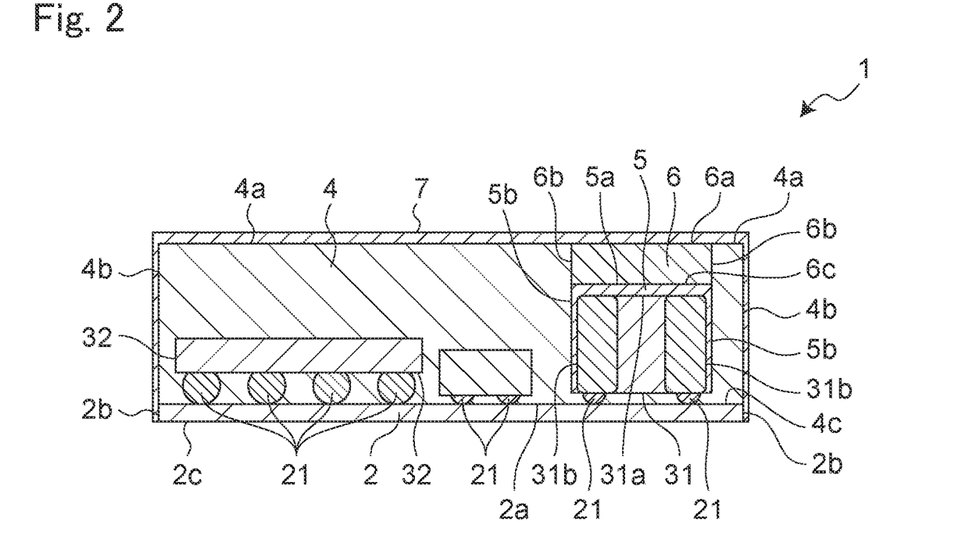
FIG. 2 is a cross-sectional view of the module of FIG. 1 taken along line A1-A1.

A module according to an embodiment of the present disclosure will be described with reference to FIGS. 1 and 2. FIG. 1 is a top view schematically illustrating a module according to the embodiment of the present disclosure. FIG. 2 is a cross-sectional view of the module of FIG. 1 taken along line A1-A1.

A module 1 according to the present embodiment includes a substrate 2 and components 31 and 32 mounted on an upper surface 2a which is one main surface of the substrate 2. An internal shield film 5, which is an example of a first shield film, is provided on an upper surface 31a of the component 31. In the present embodiment, the internal shield film 5 is also provided on a side surface 31b of the component 31. Surface roughness of the internal shield film 5 provided on the upper surface 31a of the component 31 is greater than surface roughness of the internal shield film 5 provided on a side surface of the component 31. The surface roughness in the present embodiment is measured as an arithmetic mean roughness (Ra) in accordance with JIS (Japanese Industrial Standards) B0601 (2013) (corresponding International Standard: ISO 4287:1997). For measurement of the surface roughness, for example, a stylus type surface roughness measuring instrument or a non-contact type surface roughness measuring instrument can be used. The stylus type surface roughness measuring instrument scans a surface of an object to be measured with a needle, and measures an uneven shape. The non-contact type surface roughness measuring instrument irradiates a surface of an object to be measured with laser or light to perform scanning, and measures an uneven shape. As the non-contact type surface roughness measuring instrument, for example, a laser type VK-120 (model number) manufactured by KEYENCE CORPORATION or an optical type VR-3000 (model number) manufactured by KEYENCE CORPORATION can be used.

Further, the module 1 includes sealing resin 4 provided on the upper surface 2a of the substrate 2 so as to seal the components 31 and 32. An external shield film 7, which is an example of a second shield film, is provided on an upper surface 4a of the sealing resin 4. A low dielectric member 6 having a dielectric constant lower than a dielectric constant of the sealing resin 4 is provided between the internal shield film 5 and the external shield film 7. Hereinafter, a dielectric constant in the present embodiment is measured as a relative dielectric constant (Er) in accordance with JIS (Japanese Industrial Standards) C2138 (2007) (corresponding International Standard: IEC 60250:1969). An upper surface 6a of the low dielectric member 6 and the external shield film 7 face each other. A lower surface 6c of the low dielectric member 6 and the internal shield film 5 face each other. A side surface 6b of the low dielectric member 6 is covered with the sealing resin 4.

As illustrated in FIG. 2, the substrate 2 has the upper surface 2a as one main surface, a lower surface 2c as the other main surface, and a side surface 2b connecting outer peripheral portions of the upper surface 2a and the lower surface 2c. The substrate 2 may be either a single-layer substrate or a multilayer substrate. The substrate 2 is made from, for example, glass epoxy resin, low-temperature co-fired ceramic, or high-temperature co-fired ceramic.

A mounting electrode (not illustrated) is provided on the upper surface 2a of the substrate 2. The components 31 and 32 are mounted on the mounting electrode via a solder bump 21. The components 31 and 32 are, for example, resistors, capacitors, inductors, filters, or semiconductor elements such as integrated circuits or power amplifiers. The filter is a surface acoustic wave filter, a bulk acoustic wave filter, a ceramic LC filter, or the like. In the present embodiment, a plurality of types of the components 32 are provided.

The mounting electrode is made from, for example, a conductive material of copper (Cu), silver (Ag), aluminum (Al), or a compound of these types of metal. The mounting electrode may be plated with nickel (Ni)/gold (Au).

The upper surface 31a and the side surface 31b of the component 31 are covered with the internal shield film 5. The internal shield film 5 is formed of metal which is passive metal and transition metal or an alloy containing the metal, and shields an electromagnetic wave.

The internal shield film 5 is formed by, for example, a sputtering method or a vapor deposition method. A film thickness of the internal shield film 5 is, for example, 2 μm or more and less than 5 μm.

The internal shield film 5 shields an electromagnetic wave radiated from the outside or from the component 32. For this reason, the component 31 is hardly affected by an electromagnetic wave radiated from the outside or from the component 32. Therefore, malfunction of the component 31 may be prevented. Further, the internal shield film 5 also shields an electromagnetic wave radiated by the component 31. For this reason, the component 32 is hardly affected by an electromagnetic wave radiated by the component 31. Therefore, malfunction of the component 32 may also be prevented.

The components 31 and 32 are sealed with the sealing resin 4 provided on the upper surface 2a of the substrate 2. The sealing resin 4 has an abutting surface 4c abutting on the upper surface 2a of the substrate 2, the upper surface 4a facing the abutting surface 4c, and a side surface 4b connecting the upper surface 4a and an outer peripheral portion of the abutting surface.

The sealing resin 4 is made from, for example, epoxy resin. Further, the sealing resin 4 may contain, for example, a silica filler or an alumina filler. A value of a dielectric constant of the sealing resin 4 is 3.5 or more and 4.0 or less.

The low dielectric member 6 is made from, for example, polytetrafluoroethylene (PTFE), thermosetting low dielectric resin, or a liquid crystal polymer (LCP). The low dielectric member 6 has a dielectric constant lower than a dielectric constant of the sealing resin 4. For example, a dielectric constant of PTFE is 2.1. A dielectric constant of "SLK series" manufactured by Shin-Etsu Chemical Co., Ltd. as an example of thermosetting low dielectric resin is 2.3. A dielectric constant of an LCP is 3.0. Note that the low dielectric member 6 may contain a silica filler or a filler of alumina in order to secure strength of the member itself. In order to obtain a low dielectric constant, a content of the filler is desirably smaller than that of the sealing resin 4.

The external shield film 7 is formed by, for example, a sputtering method or a vapor deposition method. A film thickness of the external shield film 7 may be, for example, 2 μm or more and less than 5 μm.

The external shield film 7 shields an electromagnetic wave radiated from the outside. For this reason, the components 31 and 32 are less likely to be affected by an electromagnetic wave radiated from the outside. Therefore, malfunction of the components 31 and 32 is prevented. Further, the external shield 7 film also shields an electromagnetic wave radiated by the components 31 and 32. For this reason, the components 31 and 32 are less likely to affect the outside with an electromagnetic wave. Therefore, for example, when the module 1 is mounted on a mother board, malfunction of other electronic components mounted on the mother board may also be prevented.

The internal shield film 5 and the external shield film 7 may have a multilayer structure. For example, the external shield film 7 includes an adhesive film stacked on the low dielectric member 6, a conductive film stacked on the adhesive film, and a protective film stacked on the conductive film. The adhesion film is provided to enhance adhesion between the low dielectric member 6 and the conductive film, and is made from, for example, stainless steel (SUS). The conductive film has a function of shielding an electromagnetic wave, and is made from, for example, copper (Cu), silver (Ag), or aluminum (Al). The protective film is provided to protect the conductive film from corrosion, damage, or the like, and is made from, for example, stainless steel (SUS). The internal shield film 5 may have a similar configuration.

Further, in the present embodiment, the external shield film 7 is formed of metal which is passive metal and transition metal or an alloy containing the metal. The "passive metal" mentioned here means metal that easily forms a passive state. That is, a material of an adhesion layer and oxygen are bonded for oxidation to form a passive state. Examples of the metal which is passive metal and transition metal include titanium (Ti), chromium (Cr), nickel (Ni), and molybdenum (Mo). Further, examples of the alloy containing the metal include stainless steel (SUS).

Figure 3:
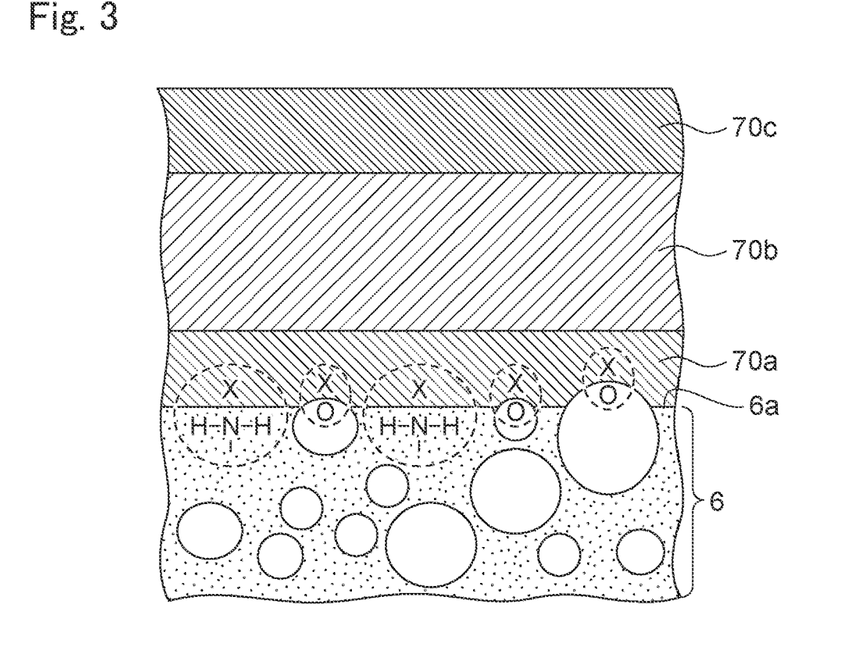
FIG. 3 is an enlarged schematic view of a contact portion between a low dielectric member and an external shield film.
Figure 4:
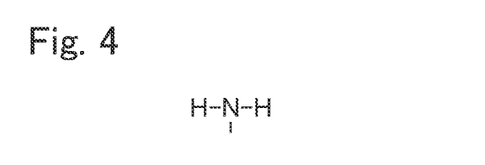
FIG. 4 is a diagram illustrating a structure of a nitrogen functional group.

As illustrated in FIG. 3, for example, a surface of the low dielectric member 6 in contact with the external shield film 7 can contain a nitrogen functional group. The nitrogen functional group is as illustrated in FIG. 4. In FIG. 3, the external shield film 7 includes an adhesive film 70a, a conductive film 70b, and a protective film 70c. The adhesive film 70a is in contact with the low dielectric member 6. A nitrogen functional group is formed near a boundary surface between the adhesive film 70a and the low dielectric member 6. The mark "X" in the diagram means an atom of metal which is passive metal and transition metal. The mark "O" in the diagram means an oxygen atom. Note that "O" bonded to "X" is present in a filler contained in the low dielectric member 6.

In the present embodiment, an adhesion layer is formed of metal which is passive metal and transition metal or an alloy containing the metal. By forming a nitrogen functional group on a surface of the low dielectric member 6 before forming the adhesion layer, transition metal of the adhesion layer can be brought into close contact with the nitrogen functional group by a coordinate bond. As a method of forming a nitrogen functional group on a surface of the low dielectric member 6, for example, there is a method of irradiating with nitrogen ions. By irradiating with nitrogen ions, a surface of the low dielectric member 6 is modified and a nitrogen functional group is generated. The adhesion layer is also in close contact with a filler contained in the low dielectric member 6 due to property of passive metal. By irradiating with nitrogen ions, a surface of the low dielectric member 6 is etched. As a result, a filler contained in the low dielectric member 6 is exposed on the surface of the low dielectric member 6 after being irradiated with nitrogen ions. Since oxygen that is easily bonded to passive metal of the adhesion layer exists in the filler, passive metal of the adhesion layer is bonded to oxygen of the exposed filler, and the adhesion layer is also in close contact with the filler. When irradiation with nitrogen ions is performed, for example, it is desirable to increase a nitrogen introduction amount, lower ion acceleration voltage, and set a nitrogen functional group generation rate to be higher than an etching rate.

In a direction orthogonal to the upper surface 2a of the substrate 2, the internal shield film 5 and the external shield film 7 are arranged at close intervals of, for example, 100 μm. Parasitic capacitance is generated between these two shield films.

Assuming that a dielectric constant of a member provided between the two shield films is ε, a distance between the two shield films is d, and an area of an upper surface of the internal shield film 5 is S, a value C of the parasitic capacitance can be expressed by $C=\varepsilon S/d$ [F]. That is, the parasitic capacitance generated between the two shield films can be reduced by reducing a value of the dielectric constant of the member provided between the two shield films or widening a distance between the two shield films.

First Embodiment

Next, a method of manufacturing a module according to an embodiment of the present disclosure will be described. FIGS. 5 to 9 are cross-sectional views schematically illustrating each step in the first embodiment which is an example of the method of manufacturing a module according to the embodiment of the present disclosure.

Figure 5:
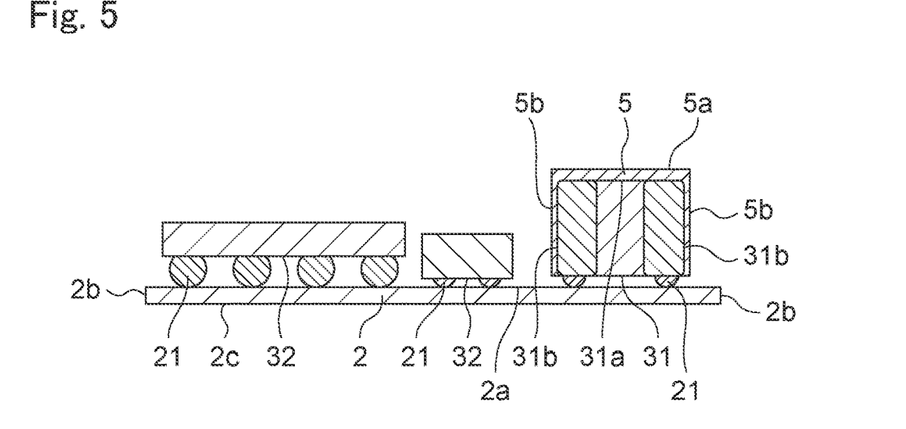
FIG. 5 is a cross-sectional view schematically illustrating an example of a method of manufacturing a module according to the embodiment of the present disclosure.

First, as illustrated in FIG. 5, the substrate 2 on which the component 31 having the internal shield film 5 is mounted on the upper surface 2a is prepared. The internal shield film 5 is provided on the upper surface 31a of the component 31. Further, the internal shield film 5 is also provided on the side surface 31b of the component 31. The component 32 is also mounted on the upper surface 2a of the substrate 2. The components 31 and 32 are mounted on the mounting electrode provided on the upper surface 2a of the substrate 2 via the solder bump 21.

Figure 6:
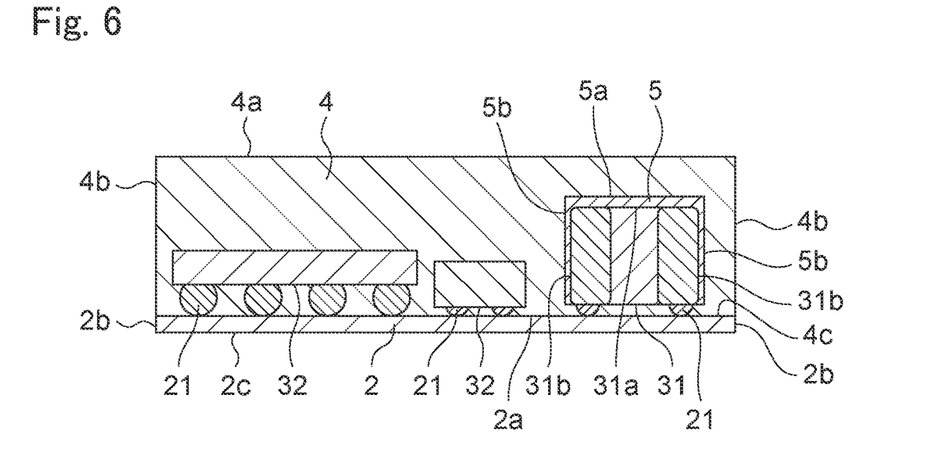
FIG. 6 is a cross-sectional view illustrating a step subsequent to FIG. 5.

Next, as illustrated in FIG. 6, the sealing resin 4 is provided on the upper surface 2a of the substrate 2 so as to seal the components 31 and 32. At this time, the sealing resin 4 seals the components 31 and 32 and the internal shield film 5.

Figure 7:
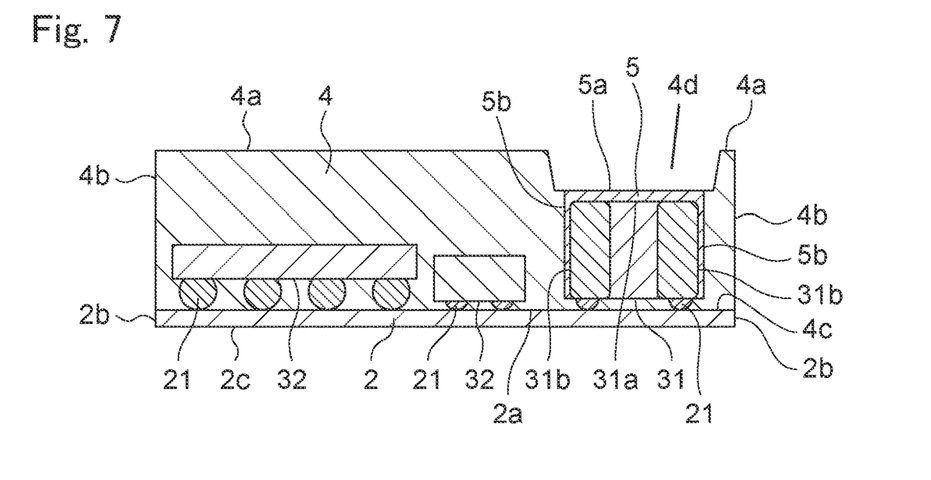
FIG. 7 is a cross-sectional view illustrating a step subsequent to FIG. 6.

Next, as illustrated in FIG. 7, a part of the sealing resin 4 is removed to form a space. Specifically, a part of the sealing resin 4 sealing the upper side of the internal shield film 5 is removed. A part of the sealing resin 4 is removed by, for example, a laser so as to be dug from the upper surface 4a of a part of the sealing resin 4 sealing the upper side of the internal shield film 5 toward an upper surface of the internal shield film 5 provided on the upper surface 31a of the component 31.

When the sealing resin 4 sealing the upper side of the internal shield film 5 is removed by a laser, a material forming the internal shield film 5 is less likely to transmit the laser. That is, even if the internal shield film 5 is irradiated with a laser, the component 31 is less likely to be damaged, so that the sealing resin 4 on the upper side of the internal shield film 5 can be reliably removed.

When a part of the sealing resin 4 sealing the upper side of the internal shield film 5 is removed by a laser, as illustrated in FIG. 7, a recess 4d which is a space formed by the sealing resin 4 and the internal shield film 5 is formed. The recess 4d that is formed expands in a tapered shape in a manner that an area of an opening portion of the recess 4d is larger than an area of an upper surface 5a of the internal shield film 5. At this time, since the sealing resin 4 is removed deeper than the upper surface 5a outside the upper surface 5a of the internal shield film 5, a part of a side surface 5b of the internal shield film 5 may be exposed from the sealing resin 4.

Figure 8:
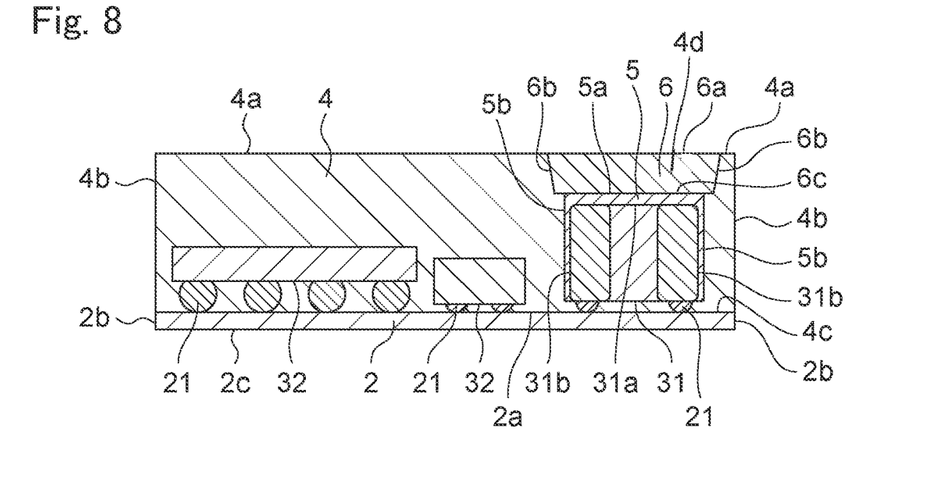
FIG. 8 is a cross-sectional view illustrating a step subsequent to FIG. 7.

Next, as illustrated in FIG. 8, the low dielectric member 6 is formed in the recess 4d. In other words, the low dielectric member 6 is formed in a space formed by removing a part of the sealing resin 4. That is, the low dielectric member 6 is formed in a tapered shape such that an area of the upper surface 6a on the external shield film 7 side is larger than an area of the lower surface 6c on the internal shield film 5 side.

Figure 9:
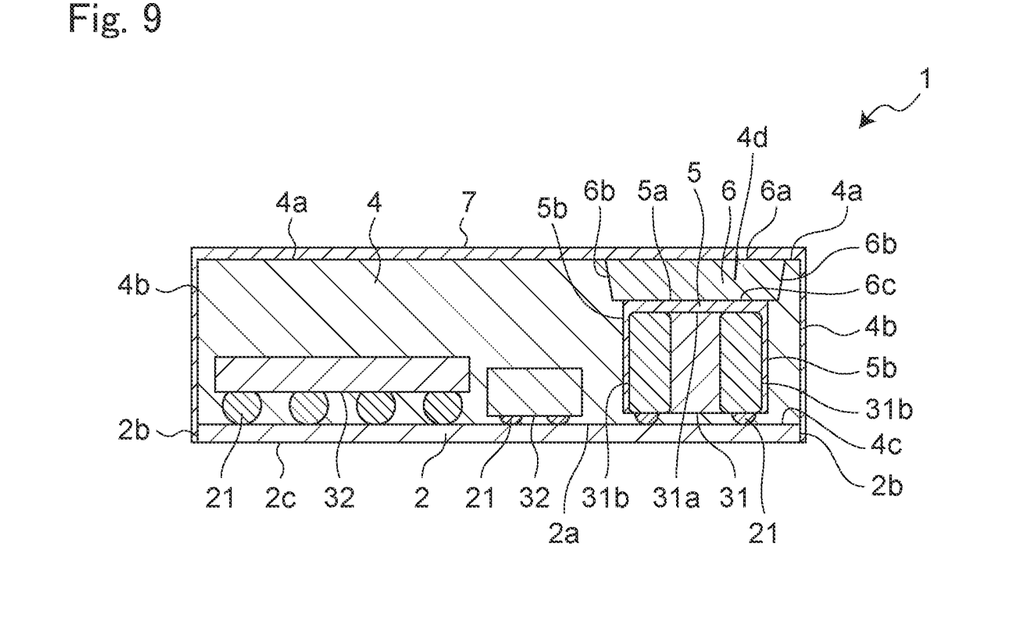
FIG. 9 is a cross-sectional view illustrating a step subsequent to FIG. 8.

Next, as illustrated in FIG. 9, the external shield film 7 is formed on the upper surface 4a of another part of the sealing resin 4 and the upper surface 6a of the low dielectric member 6. Further, the external shield film 7 is formed on the side surface 4b of the sealing resin 4 and the side surface 2b of the substrate 2. At this time, the low dielectric member 6 is arranged between the internal shield film 5 and the external shield film 7 in a direction orthogonal to the upper surface 2a of the substrate 2. In this manner, the module 1 illustrated in FIG. 9 can be obtained.

Note that, on order to improve adhesion when the internal shield film 5 and the low dielectric member 6 are in contact with each other, surface treatment may be performed on a surface of the internal shield film 5 or a surface of the low dielectric member 6.

For example, plasma may be applied to the internal shield film 5 while argon gas is allowed to flow, so that the residue of the sealing resin 4 is removed and the upper surface 5a of the internal shield film 5 is roughened. By applying plasma to the internal shield film 5 while allowing argon gas to flow, the upper surface 5a side of the internal shield film 5 is roughened more than the side surface 5b, and adhesion between the upper surface 5a of the internal shield film 5 and the low dielectric member 6 can be improved.

Second Embodiment

Next, another example of the method of manufacturing a module according to the present disclosure will be described. FIGS. 5 and 10 to 12 are cross-sectional views schematically illustrating each step in a second embodiment which is an example of the method of manufacturing a module according to the embodiment of the present disclosure.

Figure 10:
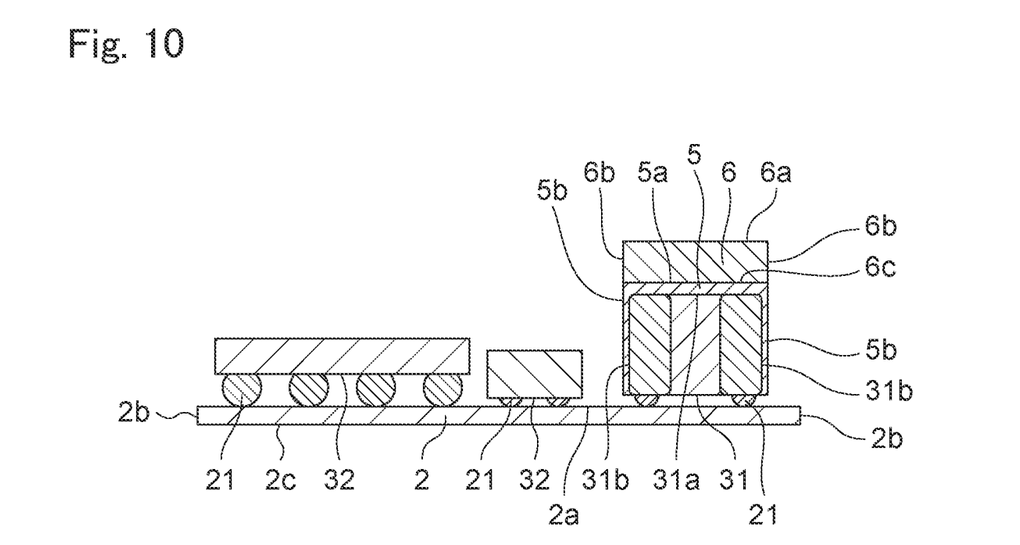
FIG. 10 is a cross-sectional view schematically illustrating another example of the method of manufacturing a module according to the embodiment of the present disclosure.

First, a step of preparing the substrate 2 on which the component 31 having the internal shield film 5 is mounted on the upper surface 2a is the same as that in the first embodiment as illustrated in FIG. 5, and thus is omitted from detailed description. Next, as illustrated in FIG. 10, the low dielectric member 6 is provided on the upper surface 5a of the internal shield film 5. The low dielectric member 6 is fixed to the upper surface 5a of the internal shield film 5 via an adhesive.

Figure 11:
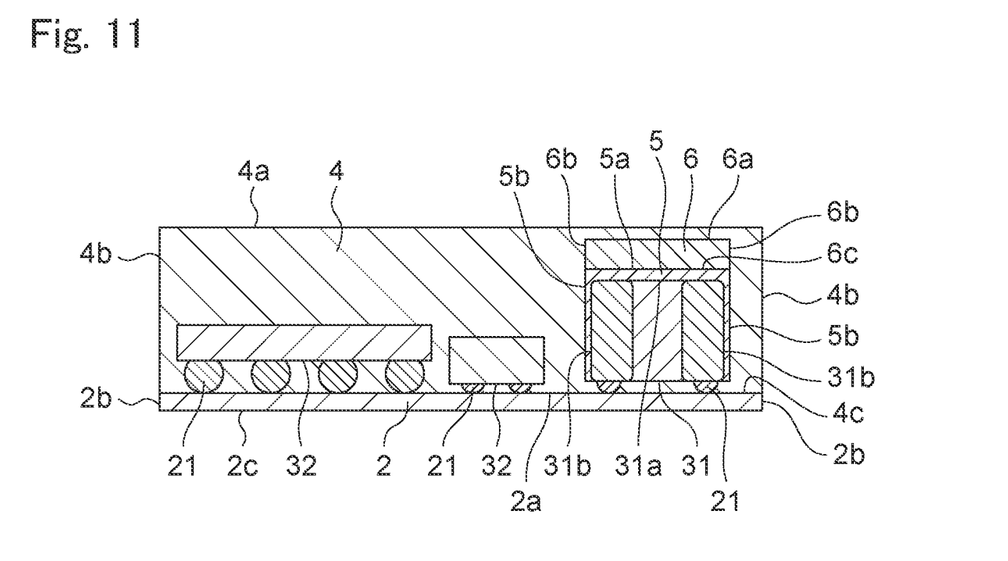
FIG. 11 is a cross-sectional view illustrating a step subsequent to FIG. 10.

Next, as illustrated in FIG. 11, the sealing resin 4 is provided on the upper surface 2a of the substrate 2 so as to seal the components 31 and 32 and the low dielectric member 6. The sealing resin 4 also seals the internal shield film 5. At this time, since the low dielectric member 6 is fixed to the upper surface 5a of the internal shield film 5 with an adhesive, it is possible to prevent displacement when the sealing resin 4 is provided.

Figure 12:
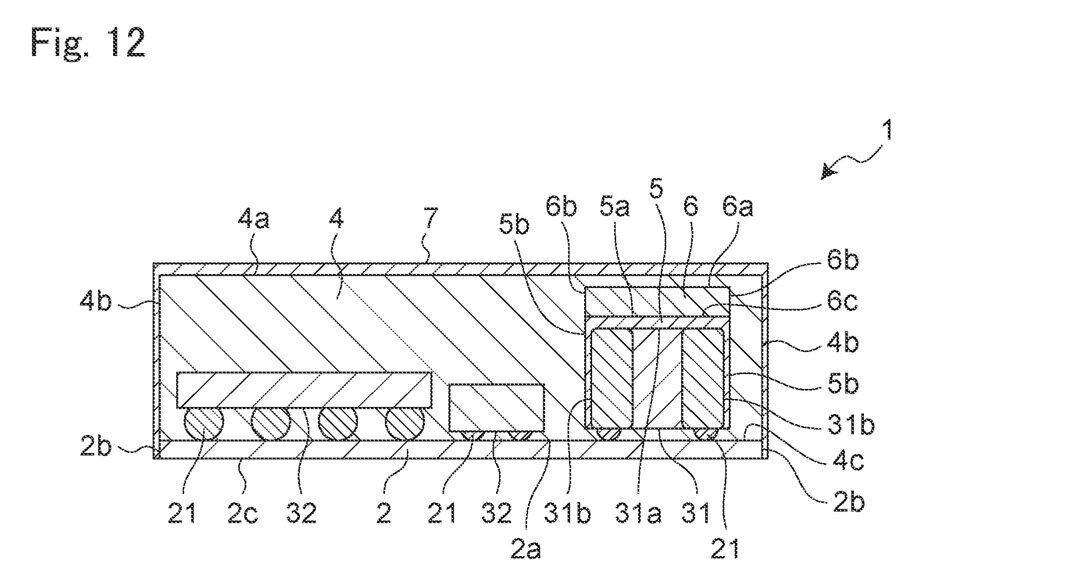
FIG. 12 is a cross-sectional view illustrating a step subsequent to FIG. 11.

Next, as illustrated in FIG. 12, the external shield film 7 is formed on the upper surface 4a of the sealing resin 4 and the upper side of the low dielectric member 6. Further, the external shield film 7 is formed on the side surface 2b of the substrate 2 and the side surface 4b of the sealing resin 4. At this time, the low dielectric member 6 is arranged between the internal shield film 5 and the external shield film 7 in a direction orthogonal to the upper surface 2a of the substrate 2. In this manner, the module 1 illustrated in FIG. 12 can be obtained.

Third Embodiment

Next, still another example of the method of manufacturing a module according to the present disclosure will be described. FIGS. 5 to 6 and 13 to 15 are cross-sectional views schematically illustrating each step in a third embodiment which is an example of the method of manufacturing a module according to the embodiment of the present disclosure.

Figure 13:
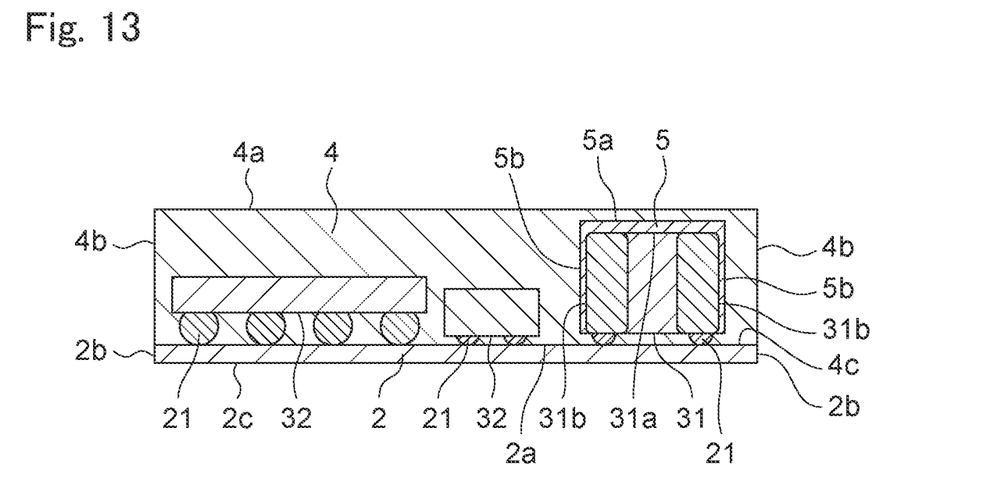
FIG. 13 is a cross-sectional view schematically illustrating still another example of the method of manufacturing a module according to the embodiment of the present disclosure.

First, a step of preparing the substrate 2 on which the component 31 having the internal shield film 5 is mounted on the upper surface 2a which is one main surface is similar to that in the first and second embodiments, as illustrated in FIG. 5. Next, a step of providing the sealing resin 4 on the upper surface 2a of the substrate 2 so as to seal the components 31 and 32 is similar to that in the first embodiment, as illustrated in FIG. 6. For this reason, detailed description of these will be omitted. Next, as illustrated in FIG. 13, a part of the sealing resin 4 is removed from the upper surface 4a of the sealing resin 4 toward the internal shield film 5 so that the components 31 and 32 are not exposed. That is, the sealing resin 4 remains on an upper surface of the internal shield film 5 without being removed. As an example, a part of the sealing resin 4 is removed as the entire upper surface 4a of the sealing resin 4 is polished from a state illustrated in FIG. 6 to a state illustrated in FIG. 13.

Figure 14:
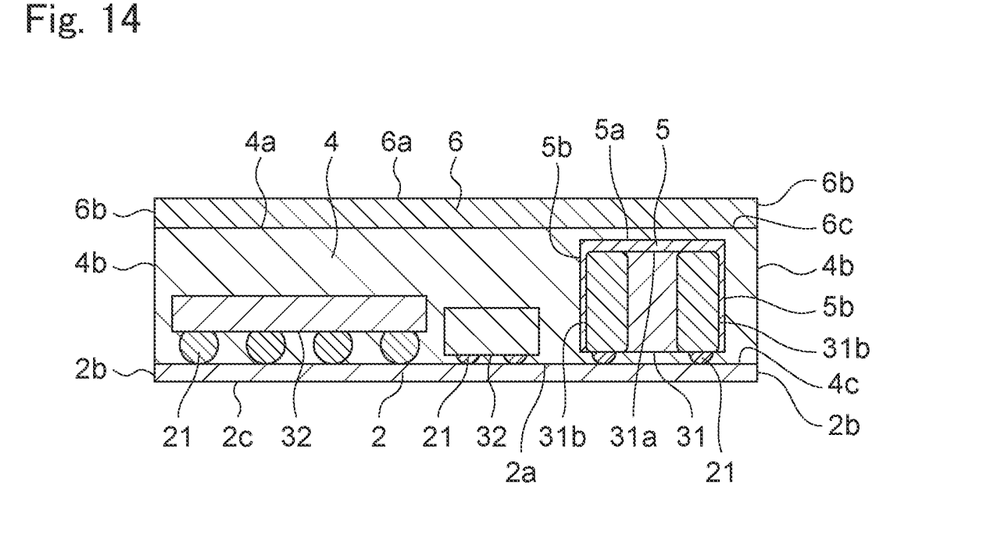
FIG. 14 is a cross-sectional view illustrating a step subsequent to FIG. 13.

Next, as illustrated in FIG. 14, the low dielectric member 6 having a dielectric constant lower than a dielectric constant of the sealing resin 4 is provided in a space formed by removing a part of the sealing resin 4. That is, as illustrated in FIG. 14, the low dielectric member 6 is provided over the entire upper surface 4a of the sealing resin 4. In order to improve adhesion between the low dielectric member 6 and the sealing resin 4, for example, the low dielectric member 6 can be pressed so as to eliminate a gap between the low dielectric member 6 and the upper surface 4a of the sealing resin 4 generated by air.

Figure 15:
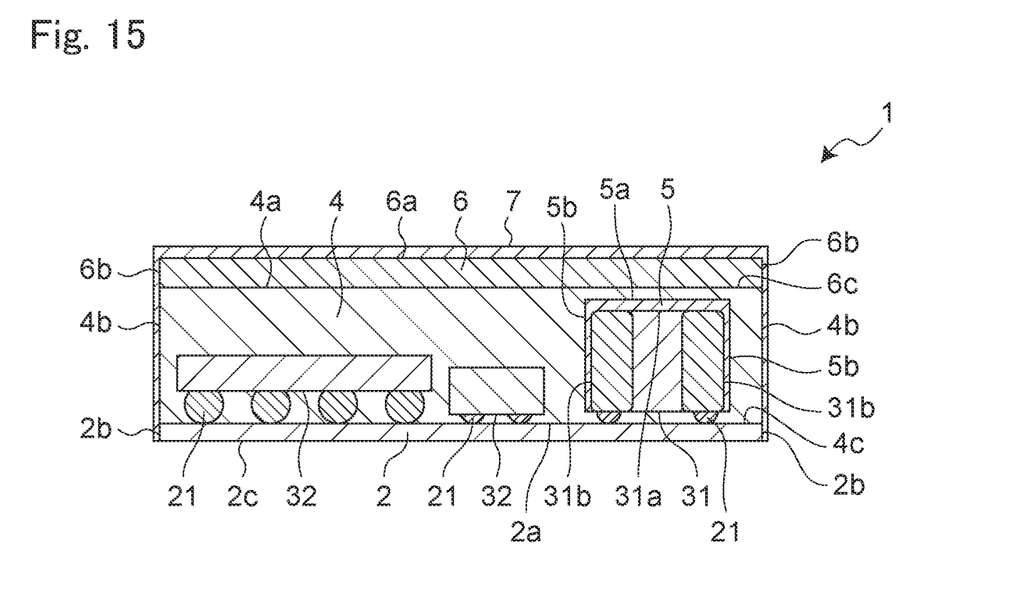
FIG. 15 is a cross-sectional view illustrating a step subsequent to FIG. 14.

Next, as illustrated in FIG. 15, the external shield film 7 is formed on the upper side of another part of the sealing resin 4 and on the upper surface 6a of the low dielectric member 6. Further, the external shield film 7 is formed on the side surface 4b of the sealing resin 4 and the side surface 2b of the substrate 2. That is, the low dielectric member 6 is arranged between the internal shield film 5 and the external shield film 7 in direction orthogonal to the upper surface 2a of the substrate 2. In this manner, the module 1 illustrated in FIG. 15 can be obtained. According to such a method, since the low dielectric member 6 is also provided on the upper side of the component 32 not covered with the internal shield film 5, parasitic capacitance can be reduced as a whole of the module 1.

The module according to the present embodiment includes the substrate 2, the components 31 and 32 mounted on the upper surface 2a which is one main surface of the substrate 2, the internal shield film 5 provided on an upper surface of the component 31, and the sealing resin 4 provided on the upper surface 2a of the substrate 2 so as to seal the component 31. Further, the external shield film 7 provided on the upper surface 4a or the upper side of the sealing resin 4, and the low dielectric member 6 arranged between the internal shield film 5 and the external shield film 7 and having a dielectric constant lower than a dielectric constant of the sealing resin 4 are provided.

According to such a configuration, the low dielectric member 6 having a dielectric constant lower than a dielectric constant of the sealing resin 4 is provided between the internal shield film 5 and the external shield film 7. As a result, parasitic capacitance generated between the internal shield film 5 and the external shield film 7 can be reduced without hindering reduction in height of the module 1.

Further, according to the module according to the present embodiment, the low dielectric member 6 is formed in a tapered shape such that an area of an upper surface on the external shield film 7 side is larger than an area of a lower surface on the internal shield film 5 side. According to such a configuration, an area of a contact surface between the external shield film 7 and the low dielectric member 6 is further expanded. As a result, the external shield film 7 and the low dielectric member 6 can be less likely to be peeled from each other.

Further, according to the module according to the present embodiment, the internal shield film 5 is further provided on a side surface of the component 31, and surface roughness of the internal shield film 5 provided on the upper surface 31a of the component 31 is greater than surface roughness of the internal shield film 5 provided on a side surface of the component 31. According to such a configuration, the low dielectric member 6 is brought into closer contact with the internal shield film 5 provided on the upper surface 31a of the component 31. As a result, parasitic capacitance generated between the internal shield film 5 and the external shield film 7 can be more reliably reduced without hindering reduction in height of the module 1.

Further, according to the module according to the present embodiment, at least one of the internal shield film 5 and the external shield film 7 is in contact with the low dielectric member 6. According to such a configuration, the low dielectric member 6 and at least one of the internal shield film 5 and the external shield film 7 are brought into contact with each other without the sealing resin 4 interposed between them. As a result, parasitic capacitance generated between the internal shield film 5 and the external shield film 7 can be more reliably reduced without hindering reduction in height of the module 1.

Further, according to the module according to the present embodiment, the external shield film 7 in contact with the low dielectric member 6 is formed of metal which is passive metal and transition metal or an alloy containing the metal. Further, a surface of the low dielectric member 6 in contact with the metal or the alloy containing the metal has a nitrogen functional group. According to such a configuration, by utilizing property as passive metal of an adhesion layer of the external shield film 7, a material of the adhesion layer and oxygen are bonded and oxidized to form a passive state. Further, by utilizing property as transition metal of the adhesion layer of the external shield film 7, a material of the adhesion layer and the nitrogen functional group formed on a surface of the low dielectric member 6 are coordinate-bonded. For this reason, the low dielectric member 6 can be brought into closer contact with the external shield film 7. As a result, parasitic capacitance generated between the internal shield film 5 and the external shield film 7 can be reduced without hindering reduction in height of the module 1.

The method of manufacturing a module according to the present embodiment includes a step of preparing the substrate 2 on which the component 31 having the internal shield film 5 is mounted on the upper surface 2a as one main surface and a step of providing the sealing resin 4 on the upper surface 2a of the substrate 2 so as to seal the component 31. Further, a step of removing a part of the sealing resin 4 from the upper surface 4a of the sealing resin 4 toward the internal shield film 5 provided on the upper surface 31a of the component 31 is included. Further, a step of providing the low dielectric member 6 having a dielectric constant lower than a dielectric constant of the sealing resin 4 in a space formed by removing a part of the sealing resin 4 is included. Further, a step of forming the external shield film 7 on the upper side or the upper surface 6a of the low dielectric member 6 and another part of the sealing resin 4 is included. According to such a method, the low dielectric member 6 having a dielectric constant lower than a dielectric constant of the sealing resin 4 is provided between the internal shield film 5 and the external shield film 7. As a result, parasitic capacitance generated between the internal shield film 5 and the external shield film 7 can be reduced without hindering reduction in height of the module 1.

Further, the method of manufacturing a module according to the present embodiment includes a step of preparing the substrate 2 on which the component 31 having the internal shield film 5 is mounted on the upper surface 2a that is one main surface. Further, a step of providing a dielectric member on the upper surface 5a of the internal shield film 5 provided on the upper surface 31a of the component 31 is included. Further, a step of providing the sealing resin 4 on the upper surface 2a of the substrate 2 so as to seal the component 31 and the dielectric member, and a step of forming a second shield film on the upper side of the dielectric member and the upper surface 4a of the sealing resin 4 are included. Furthermore, the dielectric member is the low dielectric member 6 having a dielectric constant lower than a dielectric constant of the sealing resin 4. According to such a method, the low dielectric member 6 having a dielectric constant lower than a dielectric constant of the sealing resin 4 is provided between the internal shield film 5 and the external shield film 7. As a result, parasitic capacitance generated between the two shield films can be reduced without hindering reduction in height of the module.

Note that the present disclosure is not limited to the above embodiment and example, and can be implemented in other various modes. For example, in the above description, the component 31 is a resistor, a capacitor, an inductor, a filter, or a semiconductor element such as an integrated circuit or a power amplifier, but the present disclosure is not limited to this configuration. The component 31 may be a submodule that includes a substrate, a component, sealing resin, and a shield film, and is mounted on the upper surface 2a of the substrate 2.

Further, in the above description, a part of the sealing resin 4 is removed by a laser in order to provide a recess for forming the low dielectric member 6 in a tapered shape, but the present disclosure is not limited to this configuration. For example, when the sealing resin 4 is made from photosensitive resin, a recess for forming the low dielectric member 6 in a tapered shape may be provided by removing a part of the sealing resin 4 by wet etching.

Further, in the above description, the components 31 and 32 are mounted on a mounting electrode via the solder bump 21, but the present disclosure is not limited to this configuration. For example, the components 31 and 32 may be mounted on the mounting electrode via a conductive adhesive or conductive paste.

Further, in the above description, the external shield film 7 and the low dielectric member 6 can be brought into close contact with each other by a nitrogen functional group provided on a surface of the low dielectric member 6, but the present disclosure is not limited to this configuration. For example, the sealing resin 4 and the low dielectric member 6 may be brought into close contact with each other by a nitrogen functional group provided on a surface of the low dielectric member 6.

In the second embodiment, the sealing resin 4 is provided on the upper surface 2a of the substrate 2 so as to seal the components 31 and 32 and the low dielectric member 6, and then the external shield film 7 is formed on the upper surface 4a of the sealing resin 4 and the upper side of the low dielectric member 6, but the present disclosure is not limited to this configuration. For example, after a step of providing the sealing resin 4, a step of removing a part of the sealing resin 4 to expose the upper surface 6a of the low dielectric member 6 may be further included. Further, in the step of forming the external shield film 7 subsequent to the step of exposing the upper surface 6a of the low dielectric member 6, the external shield film 7 may be formed on the exposed upper surface 6a of the low dielectric member 6 and the upper surface 4a of another part of the sealing resin 4. According to such a method, the sealing resin 4 entering between the internal shield film 5 and the external shield film 7 is removed. Further, when the sealing resin 4 is removed, a part of the low dielectric member 6 is also removed, a surface of the low dielectric member 6 becomes rough, and adhesion between the low dielectric member 6 and the external shield film 7 can be improved. As a result, it is possible to more reliably reduce parasitic capacitance generated between the two shield films without hindering reduction in height of the module.

According to the module according to the present disclosure, since parasitic capacitance generated between two shield films can be reduced without hindering reduction in height of the module, it is useful, for example, for a module including two or more shield films overlapping in a thickness direction of a substrate.

1 module
2 substrate
2a upper surface
2b side surface
2c lower surface
21 solder bump
31, 32 component
31a upper surface
31b side surface
4 sealing resin
4a upper surface
4b side surface
4c abutting surface
4d recess
5 internal shield film
5a upper surface
5b side surface
6 low dielectric member
6a upper surface
6b side surface
6c lower surface
7 external shield film
70a adhesive film
70b conductive film
70c protective film

The invention claimed is:

1. A module comprising:
a substrate;
a component mounted on an upper surface being one main surface of the substrate;
a first shield film provided on an upper surface of the component;
a sealing resin provided on the upper surface of the substrate so as to seal the component;
a second shield film provided on an upper surface or an upper side of the sealing resin; and
a low dielectric member arranged between the first shield film and the second shield film and having a dielectric constant lower than a dielectric constant of the sealing resin,
wherein at least a portion of the second shield film is disposed, via at least the low-dielectric member, on an upper surface of the first shield film on the side opposite the component, and
wherein the low dielectric member is provided in a tapered shape such that an area of an upper surface on the second shield film side is larger than an area of a lower surface on the first shield film side.

2. A module comprising:
a substrate;
a component mounted on an upper surface being one main surface of the substrate;
a first shield film provided on an upper surface of the component;
a sealing resin provided on the upper surface of the substrate so as to seal the component;
a second shield film provided on an upper surface or an upper side of the sealing resin; and
a low dielectric member arranged between the first shield film and the second shield film and having a dielectric constant lower than a dielectric constant of the sealing resin,
wherein at least a portion of the second shield film is disposed, via at least the low-dielectric member, on an upper surface of the first shield film on the side opposite the component,
wherein the first shield film is further provided on a side surface of the component, and
wherein a surface roughness of the first shield film provided on the upper surface of the component is greater than a surface roughness of the first shield film provided on a side surface of the component.

3. A module comprising:
a substrate;
a component mounted on an upper surface being one main surface of the substrate;
a first shield film provided on an upper surface of the component;
a sealing resin provided on the upper surface of the substrate so as to seal the component;
a second shield film provided on an upper surface or an upper side of the sealing resin; and
a low dielectric member arranged between the first shield film and the second shield film and having a dielectric constant lower than a dielectric constant of the sealing resin,
wherein at least a portion of the second shield film is disposed, via at least the low-dielectric member, on an upper surface of the first shield film on the side opposite the component, and
wherein the second shield film in contact with the low dielectric member is comprised of a metal being a passive metal and a transition metal or an alloy containing the metal, and a surface of the low dielectric member in contact with the metal or the alloy containing the metal has a nitrogen functional group.

4. The module according to claim 1, wherein
the first shield film is further provided on a side surface of the component, and
a surface roughness of the first shield film provided on the upper surface of the component is greater than a surface roughness of the first shield film provided on a side surface of the component.

5. The module according to claim 1, wherein at least one of the first shield film and the second shield film is in contact with the low dielectric member.

6. The module according to claim 2, wherein at least one of the first shield film and the second shield film is in contact with the low dielectric member.

* * * * *